United States Patent [19]

Hartel et al.

[11] Patent Number: 5,772,296
[45] Date of Patent: Jun. 30, 1998

[54] SWITCHGEAR CABINET

[75] Inventors: Marc Hartel, Reiskirchen; Jürgen Zachrai, Dillenburg, both of Germany

[73] Assignee: Rittal-Werk Rudolf Loh GmbH & Co. KG, Herborn, Germany

[21] Appl. No.: 750,519

[22] PCT Filed: Oct. 7, 1995

[86] PCT No.: PCT/EP95/03962

§ 371 Date: Dec. 11, 1996

§ 102(e) Date: Dec. 11, 1996

[87] PCT Pub. No.: WO96/14681

PCT Pub. Date: Mar. 17, 1996

[30] Foreign Application Priority Data

Nov. 5, 1994 [DE] Germany ............................ 44 39 692.9

[51] Int. Cl.$^6$ ............................ A47B 96/00; A47B 47/03
[52] U.S. Cl. ...................................... 312/265.1; 312/265.2
[58] Field of Search ................................ 312/263, 265.2, 312/265.1, 265.4, 265.5

[56] References Cited

U.S. PATENT DOCUMENTS

| | | | |
|---|---|---|---|
| 1,129,040 | 2/1915 | McClure | 312/263 X |
| 3,075,818 | 1/1963 | Fay | 312/265.4 |
| 3,307,894 | 3/1967 | Collier | 312/265.2 |
| 4,650,263 | 3/1987 | Monaghan et al. | 312/108 X |
| 4,768,845 | 9/1988 | Yeh | 312/263 X |
| 4,782,637 | 11/1988 | Eriksson et al. | 312/263 X |
| 4,958,259 | 9/1990 | Berg et al. | 312/265.5 X |
| 5,498,073 | 3/1996 | Charbonneau et al. | 312/263 X |
| 5,549,372 | 8/1996 | Lewis | 312/265.5 X |
| 5,584,406 | 12/1996 | Besserer et al. | 312/265.2 X |

FOREIGN PATENT DOCUMENTS

| | | | |
|---|---|---|---|
| 1137790 | 6/1957 | France | 312/265.5 |
| 2374819 | 7/1978 | France . | |
| 2681478 | 3/1993 | France . | |
| 9110250 | 11/1991 | Germany . | |
| 4036664 | 5/1992 | Germany . | |
| 4138887 | 4/1993 | Germany . | |
| 581810 | 9/1958 | Italy | 312/265.1 |

*Primary Examiner*—Peter M. Cuomo
*Assistant Examiner*—David E. Allred
*Attorney, Agent, or Firm*—Speckman Pauley Petersen & Fejer

[57] ABSTRACT

The invention relates to a switchgear cabinet with a frame which is composed of frame members and which can be closed by a cover plate, side panels, a rear wall, and a door. To fit both optical and functional elements easily to the corners of the frame, the horizontal depth struts are designed as sections open on the outside, and the cover plate and/or side panels have chamfers which at least partly overlap the outside of the sections so that the chamfer and the outer side form a holder into which a plug-in rod of a corner piece can be inserted.

12 Claims, 1 Drawing Sheet

U.S. Patent     Jun. 30, 1998     5,772,296
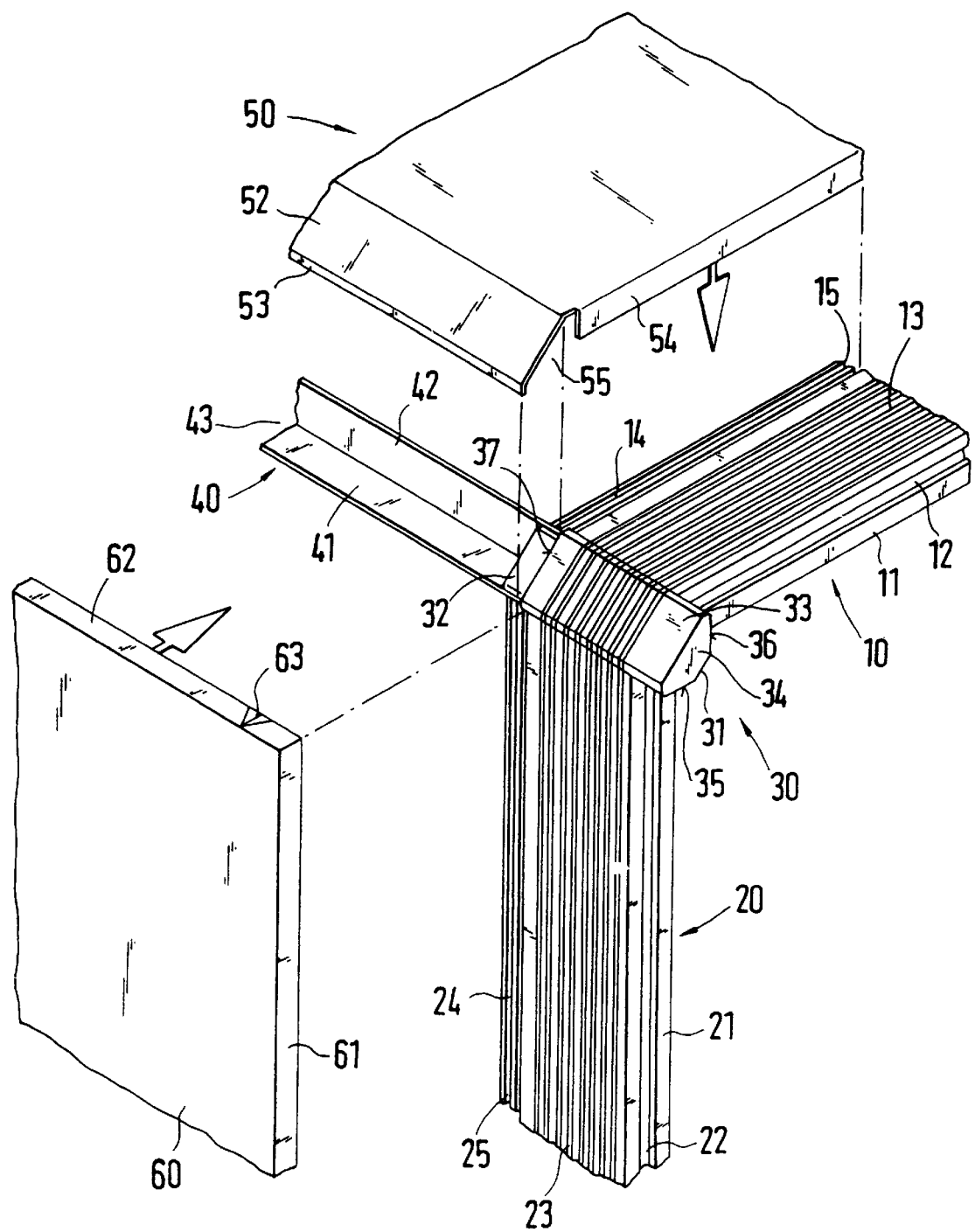

SWITCHGEAR CABINET

BACKGROUND OF THE INVENTION

Field of the Invention

This invention relates to a switchgear cabinet with a cabinet frame formed of frame legs, which can be closed by a cover, side elements, a rear wall and a cabinet door.

The cabinet frame is assembled from twelve frame legs, which are connected with each other on the corners where they meet by corner connectors. To enclose the cabinet frame, the side walls, the cover and the rear wall are fastened in such a way that their beveled edges reach around the individual frame legs.

SUMMARY OF THE INVENTION

It is one object of this invention to provide a switchgear cabinet of the type mentioned above with corner area visual and functional elements that can be fastened in a simple manner.

The object of this invention is attained with horizontal depth struts that are embodied as angled profile sections open toward the exterior. The cover and/or the side elements have beveled edges which at least partially cover the outside of the profiled sections, wherein a receptacle is formed by the beveled edge and the outside of the receptacle into which a plug-in neck of a corner element is inserted.

A corner element can be applied and subsequently fixed in place within the receptacle in an area between the depth strut and the beveled edge of the cover or the side wall. In addition to fixing the corner element in place, the receptacle also assumes a positioning function which permits an exact alignment of the corner element. The corner element itself can be designed to meet the individual visual and functional requirements.

In accordance with one preferred embodiment of this invention, the depth strut is formed as an angled profile section with two legs, to which a horizontal and a vertical frame leg are attached, and the cover has the beveled edge which extends toward both ends of the legs, so that a receptacle which is triangular in cross section is formed between the beveled edge and the two legs of the angled profile section.

The frame legs can be easily screwed to the depth strut. Screw receptacles are cut into the depth strut, into which the fastening screws can be inserted and can be screwed into threaded receivers of the frame legs. The corner element can be used to cover the screw heads. Subsequently the corner element is fixed in place in the generally triangular receptacle with a generally triangular plug-in neck so the corner element cannot be rotated.

In a preferred embodiment of this invention at least one upper corner element and one lower corner element of an associated side of the frame body has a base element adjoining the plug-in neck, which is extended beyond the front of the switchgear cabinet and which has receptacles or necks for door hinges and/or a locking bar arrangement. If, for example, the door hinges are alternatively on the other side of the cabinet frame, the corner elements are simply changed to the other side. It is then possible to fix the door on the corner elements at a position which is rotated by 180°. It is also possible to have the door hinges on one side of the cabinet frame by using two corner elements and the receptacle of the locking bar arrangement on the other side.

In order to achieve a visual finish on the rear of the switchgear cabinet, for example, it is also possible for the base elements to end flush with the front or rear of the cabinet frame.

If the plug-in necks of the corner elements make a transition into the base element by way of shoulders, the insertion movement of the corner elements can be limited. It is thus possible to achieve the exact position of the corner elements. This is primarily of importance for the connection of the corner elements for hinging a door or for receiving the locking bar arrangement.

For sealing the switchgear cabinet, seals are inserted into the longitudinal grooves of the horizontal and vertical frame legs, on which the edges of the cover and the side elements press.

For sealing the rear wall and the switchgear cabinet door the horizontal and the vertical frame legs can have front faces which face the front or the rear of the cabinet frame. In an area of the front faces, the corner element has a level connecting surface on its base element, which makes a transition into the two front faces, and circumferential seals for sealing the rear wall and/or the cabinet door can be applied to the front faces and the connecting surfaces of the corner elements.

If the corner element is embodied so that the portion of the base element which forms outer surfaces makes a transition into outward facing lateral surfaces of the connected frame legs, a visual finish is accomplished in a corner area of the switchgear cabinet.

BRIEF DESCRIPTION OF THE DRAWINGS

This invention will be explained in more detail below by means of an exemplary embodiment represented in the drawings, wherein:

The FIGURE is an exploded perspective view of a corner area of a cabinet frame, to which a cover and a side wall are connected.

DESCRIPTION OF PREFERRED EMBODIMENTS

The cabinet frame is assembled from horizontal and vertical frame legs 10, 20 and depth struts 40. The horizontal and vertical legs 10, 20 form a complete frame on the front and the rear of the switchgear cabinet. The front and the rear frames are connected with each other by means of the depth struts 40. The depth struts 40 are used to connect the individual frame legs 10, 20 with respect to each other, such as with screw receptacles. Screw receptacles which extend in a longitudinal direction along the frame legs are cut and are aligned with the screw receptacles in the depth struts 40. The frame legs 10, 20 can be fastened on the legs 41, 42 of the depth strut 40 by means of fastening screws, which are inserted into the screw receptacles of the depth strut 40 and rotated into the longitudinally oriented screw receptacles of the frame legs 10, 20. Here the depth strut 40, which is preferably embodied as an angled profile section, is open toward an outside, facing away from the switchgear cabinet interior.

The horizontal and the vertical frame legs 10, 20 are embodied similar to each other. The horizontal and the vertical frame legs 10, 20 have a front face 11, 21 facing the front or the rear of the switchgear cabinet, into which a longitudinally oriented groove 12, 22 is cut and embodied as a seal receptacle. The front face 11, 21 makes a right-angled transition into a side, outward facing surface 13, 23. The side surface has longitudinal grooves. A shoulder 14, 24, facing away from the front face 11, 21, adjoins the lateral surface 13, 23. The shoulder 14, 24 has a longitudinal groove 15, 25. The shoulders 14, 24 of the frame legs 10, 20 make a flush transition into ends of the legs 41, 42 of the depth strut 40. The groove bottom of the sealing receptacles 12, 22 of the front faces, 11, 21 terminate flush with the front faces 11, 21 of the depth strut 40.

The cabinet frame thus formed can be enclosed by means of a cover 50, side walls 60, a rear wall, not shown in the drawings, and a cabinet door. The side wall 60 has edges 61, 62 facing the switchgear cabinet. The edge 61 of side wall 60 is inserted into the longitudinal groove 25. A recess 63 in the edge 62 makes the insertion possible. The recess 63 extends over a strip adjoining the longitudinal groove 25.

The upper edge 62 of the side wall 60 is mounted beneath the horizontal leg 41 of the depth strut 40. Sealing elements for sealing the side wall 60 are disposed in the longitudinal grooves 25 of the vertical frame legs 20, and between the edge 62 and the horizontal leg 41. The side walls 60 on the cabinet frame are fastened with respect to the vertical frame legs 20 by means of attachment screws, not shown in detail.

The cover 50 has a front and a rear edge 54. The edges 54 engage the longitudinal grooves 15 of the horizontal frame legs 10. Seals can also be mounted within the longitudinal grooves 15 for sealing. Following the cover surface, the cover 50 makes a transition into a beveled edge 52, which is angled by 45°. The beveled edge 52 extends over both ends of the legs 41, 42 of the depth strut 40. In this way a receptacle, triangular in cross section, is formed between the beveled edge 52 and the outside 43 of the depth strut 40. The receptacle is open toward the front and toward the rear of the switchgear cabinet. Access to the receptacle is provided via notches 55 of the top 50.

A neck 53, vertically downward directed from the beveled edge 52, is beveled for covering the horizontal leg 41 of the depth strut 40. A plug-in neck 32 of a corner element 30 can be inserted into the receptacle formed between the beveled edge 52 and the depth strut 40. The plug-in neck 32 is offset from a base element 33 of the corner element 30 by means of a shoulder 37. The plug-in neck 32, triangular in cross section, is adapted to the receptacle. The base element 33 projects beyond the front faces 11, 21 of the horizontal and vertical frame legs 10, 20. The contact surfaces 35, 36 of the corner element 30 rest against the legs 41, 42 of the depth strut 40. A receptacle for a locking bar arrangement or a hinge arrangement is cut into the contact surface 35. An upper and a lower corner element 30 of one side of the cabinet frame has receptacles, for example for receiving the hinges of the door, into which the hinge bolts of the door enter. It is possible to attach the corner elements 30, appropriately embodied to receive the locking bolts, on the other side of the cabinet frame. If it is desired to change the hinge shaft to the other side of the cabinet frame, it is merely necessary to change the corner elements 30.

Fixing the corner elements 30 in place is accomplished by means of the plug-in neck 32 and by screw connections with the depth strut 40 or the frame legs 10, 20. In addition, the cabinet frame is stiffened by the fixed connection of the corner elements 30.

Recesses for sealing the hinged door are cut into the forward oriented front faces 34 of the corner elements 30. The recesses make transitions into connecting faces which end together with the front faces 11, 21 or the groove bottom of the sealing receptacles 12, 21 of the frame legs 10, 20. It is thus possible to insert circumferential seals, for example also HF seals. The corner elements 30, whose front face 34 terminates flush with the front faces 11, 21 of the frame legs 10, 20, can be used at the rear of the switchgear cabinet. It is thus also possible to exchange the rear wall for the switchgear cabinet door. It is only required to change the corner elements 30 of the rear to the front and, correspondingly, the corner elements 30 of the front to the rear. The corner element 30 in one preferred embodiment has an inclined surface with longitudinal grooves, which make a transition into the longitudinal grooves of the lateral surfaces 13, 23 of the legs 10, 20. The corner element 30 is thus visually integrated into the cabinet frame, so that there is an impression of a seamless transition of the horizontal into the vertical frame leg.

We claim:

1. In a switchgear cabinet with a cabinet frame having frame legs and which can be closed by a cover, a side wall, a rear wall and a cabinet door, the improvement comprising:
    a plurality of depth struts (40) each having a profile section forming a recess opening toward an exterior, and at least one of the cover (50) and the side wall (60) having a beveled edge (52) which at least partially covers the recess (43) of the profile section and bridges at least two outer ends of the profile section, the beveled edge (52) and the recess forming a receptacle into which is inserted a plug-in neck (32) of a corner element (30); and
    the corner element (30) having a base element (33) adjoining the plug-in neck (32), and a shoulder (37) formed at a transition between the plug-in neck (32) and the base element (33).

2. In a switchgear cabinet in accordance with claim 1, wherein
    each of the depth struts (40) is formed as an angled profile section by two legs (41, 42) to which a horizontal frame leg (10) and a vertical frame leg (20 are attached, and
    the cover (50) having the beveled edge (52) extending toward both ends of the legs (41, 42), the beveled edge (52) and the two legs (41, 42) of the angled profile section (40) forming a receptacle with a triangular cross section.

3. In a switchgear cabinet with a cabinet frame having frame legs and which can be closed by a cover, a side wall, a rear wall and a cabinet door, the improvement comprising:
    a plurality of depth struts (40) each having a profile section forming a recess opening toward an exterior, and at least one of the cover (50) and the side wall (60) having a beveled edge (52) which at least partially covers the recess of the profile section, the beveled edge (52) and the recess forming a receptacle into which is inserted a plug-in neck (32) of a corner element (30);
    each of the depth struts (40) formed as an angled profile section by two legs (41, 42) to which a horizontal frame leg (10) and a vertical frame leg (20) are attached;
    the cover (50) having the beveled edge (52) extending toward both ends of the legs (41, 42), the beveled edge (52) and the two legs (41, 42) of the angled profile section forming a receptacle with a triangular cross section; and
    the corner element (30) of an associated side of the cabinet frame having a base element (33) adjoining the plug-in neck (32), the base element (33) extending at least as far as a front of the switchgear cabinet.

4. In a switchgear cabinet in accordance with claim 3, wherein
    the plug-in neck (32) makes a transition into the base elements (33) by shoulder (37).

5. In a switchgear cabinet in accordance with claim 4, wherein the horizontal frame leg (10) and the vertical frame leg (20) have longitudinal grooves (15, 25), respectively, which are engaged by a beveled edge (54) of the cover (50) and a beveled edge (61) of the side wall (60) respectively.

6. In a switchgear cabinet in accordance with claim 5, wherein the horizontal frame leg (10) and the vertical frame leg (20) have front faces (11, 21), respectively, which face one of a front and a rear of the cabinet, and in an area of the two front faces (11, 21) the corner element (30) has a flat connecting surface on the base element (33) which makes a transition into the front faces (11, 21).

7. In a switchgear cabinet in accordance with claim 6, wherein a portion of the base element (33) of the corner element (30) forming an outer surface makes a transition into outward facing lateral surfaces (13, 23) of the frame legs (10, 20).

8. In a switchgear cabinet with a cabinet frame having frame legs and which can be closed by a cover, a side wall, a rear wall and a cabinet door, the improvement comprising:

a plurality of depth struts (40) each having a profile section forming a recess opening toward an exterior, and at least one of the cover (50) and the side wall (60) having a beveled edge (52) which at least partially covers the recess of the profile section, the beveled edge (52) and the recess forming a receptacle into which is inserted a plug-in neck (32) of a corner element (30);

the corner element (30) of an associated side of the cabinet frame having a base element (33) adjoining the plug-in neck (32), the base element (33) extending at least as far as a front of the switchgear cabinet.

9. In a switchgear cabinet in accordance with claim 1, wherein the corner element (30) ends flush with a front of the cabinet frame.

10. In a switchgear cabinet with a cabinet frame having frame legs and which can be closed by a cover, a side wall, a rear wall and a cabinet door, the improvement comprising:

a plurality of depth struts (40) each having a profile section forming a recess opening toward an exterior, and at least one of the cover (50) and the side wall (60) having a beveled edge (52) which at least partially covers the recess of the profile section, the beveled edge (52) and the recess forming a receptacle into which is inserted a plug-in neck (32) of a corner element (30);

a horizontal frame leg (10) and a vertical frame leg (20) are joined at right angles to one of the depth struts (40), the horizontal frame leg (10) and the vertical frame leg (20) having longitudinal grooves (15, 25), respectively, which are engaged by a beveled edge (54) of the cover (50) and a beveled edge (61) of the side wall (60) respectively.

11. In a switchgear cabinet with a cabinet frame having frame legs and which can be closed by a cover, a side wall, a rear wall and a cabinet door, the improvement comprising:

a plurality of depth struts (40) each having a profile section forming a recess opening toward an exterior, and at least one of the cover (50) and the side wall (60) having a beveled edge (52) which at least partially covers the recess of the profile section, the beveled edge (52) and the recess (43) forming a receptacle into which is inserted a plug-in neck (32) of a corner element (30);

a horizontal frame leg (10) and a vertical frame leg (20) of the frame legs joining the depth struts (40) at right angles thereto and having front faces (11, 21), respectively, which face one of a front and a rear of the cabinet, and in an area of the front faces (11, 21) the corner element (30) having a flat connecting surface on the base element (33) which makes a transition into the front faces (11, 21).

12. In a switchgear cabinet with a cabinet frame having frame legs and which can be closed by a cover, a side wall, a rear wall and a cabinet door, the improvement comprising:

a plurality of depth struts (40) each having a profile section forming a recess opening toward an exterior, and at least one of the cover (50) and the side wall (60) having a beveled edge (52) which at least partially covers the recess of the profile section, the beveled edge (52) and the recess forming a receptacle into which is inserted a plug-in neck (32) of a corner element (30);

a portion of the base element (33) of the corner element (30) forming an outer surface making a transition into outward facing lateral surfaces (13, 23) of the frame legs (10, 20), the frame legs (10, 20) being joined at right angles relative to one of the depth struts (40) and being at right angles relative to each other.

* * * * *